357-13 SF
3/4/86 OR H 000,025

United States Statutory Invention Registration [19]

[11] Reg. Number: H29
[45] Published: Mar. 4, 1986

Christou et al.

[54] TUNNETT DIODE AND METHOD OF MAKING

[75] Inventors: Aristos Christou, Springfield; John E. Davey, Alexandria, both of Va.

[73] Assignee: The Government of the United States, Washington, D.C.

[21] Appl. No.: 437,915

[22] Filed: Jan. 4, 1983

[51] Int. Cl.[4] ..... H01L 29/26; H01L/29/88; H01L/29/90;H01L/29/48

[52] U.S. Cl. ..... 357/13; 357/12; 357/15; 357/16; 357/89; 357/67; 148/DIG. 72; 148/DIG. 56; 148/DIG. 140; 148/DIG. 58;

[58] Field of Search ..... 357/12, 13, 89, 15, 357/16, 3, 91, 67; 331/107 T, 107 R; 148/DIG. 72, DIG. 56, DIG. 140, DIG. 58

[56] References Cited

U.S. PATENT DOCUMENTS

| | | | |
|---|---|---|---|
| 3,739,243 | 6/1973 | Semichon et al. | 357/12 |
| 3,852,794 | 12/1974 | Pearson et al. | 357/3 |
| 3,964,084 | 6/1976 | Andrews, Jr. et al | 357/15 |
| 4,128,733 | 12/1978 | Fraas et al. | 136/895 J |
| 4,263,605 | 4/1981 | Christou et al. | 357/91 |

OTHER PUBLICATIONS

A. Christou and J. Davey, "Low Barrier Height Epitaxial Ge-GaAs Mixer Diodes"; Electronics Lett. vol. 15, No. 11, pp. 324–325, 1979.

*Primary Examiner*—John F. Terapane
*Assistant Examiner*—Howard J. Locker
*Attorney, Agent, or Firm*—W. R. Guffey; W. T. Ellis

[57] ABSTRACT

A TUNNETT (tunneling transit time) electronic device comprising a very thin injector uniformly doped at a high concentration, a thin drift region of lower doping of the same semiconductivity type, and a collector of high doping of the same semiconductivity type. A Schottky barrier is formed by placing a metal electrode on the injector and an ohmic contact may be made on the collector. In a preferred embodiment the injector is made of Ge grown on the drift region by vacuum epitaxy. The drift region is preferably GaAs grown by epitaxy on a GaAs collector.

8 Claims, 4 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

TUNNETT DIODE AND METHOD OF MAKING

BACKGROUND

This invention relates generally to solid state microwave devices and in particular to a TUNNETT diode and the method of making it.

The use of solid state electronic devices for microwave application has been the object of research and development effort for many years. Solid state devices are generally considered to be less expensive, more compact, more rugged, more reliable and more efficient than other active microwave devices such as travelling wave tubes. Although the frequency response of normal semiconductor devices such as transistors has been increased in recent years to the low gigahertz range, many microwave systems are operating at frequencies up to 40 GHz. Furthermore, a crowded electromagnetic spectrum and high data rates are forcing the consideration of use of millimeter and submillimeter microwaves. The millimeter band extends from 30 GHz to 300 GHz while the submillimeter band extends to over 1000 GHz. If sufficiently good microwave devices can be made for these frequencies, their use will provide additional benefits such as compact equipment, small antennas, high directionality and low power requirements.

Several special microwave devices have been discovered which operate at frequencies in the submillimeter as well as millimeter range. Many of these are discussed in S. M. Sze's second edition of Physics of Semiconductor Devices, Wiley, 1981. One of these types of special microwave devices is the tunnel diode which is heavily doped on both sides of its p-n junction. This junction is made abrupt so that there is a large probability of quantum mechanical tunneling across the p-n junction. As long a majority carrier electron states in the conduction band on the n-side (or hole states in the valence band on the p-side) are present at energies for which there are electron (or holes) states on the other side of the junction, current increases with increasing voltage. However, if the forward voltage is raised to the point that the bands on one side have energies corresponding to the band gap on the other side of the tunneling junction, there are no states to which to tunnel. As a result, the current-voltage (I-V) curve reaches a peak and then falls. In the region beyond the peak, the static resistance, I/V, falls. Thus if the tunnel diode is biased at an operating point on the falling I-V curve, and has small oscillations about the operating joint, the negative dynamic resistance, dI/dV, will cause the tunnel diode to act as an amplifier.

Another general class of special microwave device relies on transit time delays. There are several specialized types of transit time devices such as an IMPATT (impact ionization avalanche transit time), BARITT (barrier injection transit time) and TUNNETT (tunneling transit time). The last mentioned device is the subject of this application. All of these devices rely to greater or lesser extent on the finite transit time that an injected pulse of carriers takes to cross a drift region. When operated at a sufficiently high frequency, the injected current pulse is collected out of phase from the impressed voltage pulse. The non-linear characteristics of such a device can be used for applications such as mixers and detectors. With proper design these devices can be shown to exhibit negative dynamic resistance for some range of frequencies. Thus they can operate as microwave amplifiers.

A unified analytic model of IMPATTs, BARRITs and TUNNETTs has been provided by P. J. McCleer et al. in Solid State Electronics, volume 24, pages 37–48, 1981 and by M. E. Elta and G. I. Haddad in IEEE Transactions on Electron Devices, volume ED-26, pages 941–947, 1979.

Such devices operate in the TUNNETT mode when their parameters are such that pure tunneling is present and the avalanche multiplication is relatively less important than tunnelling. A TUNNETT is particularly useful as a low-noise amplifier, a medium power oscillator, a self-oscillating mixer and a detector, particularly at millimeter frequencies.

Previously produced TUNNETTs have utilized a HI-LO-HI structure, i.e. the injector region and collector region have a relatively high doping concentration of the same conductivity type. The drift region between the injector and collector region is either intrinsic or of a relatively low doping concentration. Because these devices were fabricated by vapor phase epitaxy (VPE) the width of the injector region was no less than 100 nm and had a graded doping profile. As a result, performance was limited by the lack of a hyper-abrupt interface between the injector and drift regions and the inability of VPE to grow thin highly doped injector regions. The frequency response is limited by the transit time, $\tau_D = d/v_s$ where d is the combined width of the injector and drift regions and $v_s$ is the saturated carrier velocity, approximately $10^7$ cm/s. TUNNETTs made previously by VPE, liquid phase epitaxy, and molecular beam epitaxy had high junction capacitance and series resistance which lead to rapid deterioration and burnout when these devices were made to operate at high frequencies. Furthermore previous methods of fabricating TUNNETTs required that the device area scale down with frequency. As a result, a requirement for constant power or current at higher frequencies meant that the power density through the TUNNETT was increased causing increased susceptibility to burnout.

SUMMARY OF THE INVENTION

Therefore it is an object of this invention to provide a TUNNETT with improved high frequency response.

It is a further object of this invention to provide a TUNNETT having a thin, highly doped injector with a hyperabrupt junction with the drift region.

It is yet a further object of this invention to provide a TUNNETT with decreased susceptibility to burnout.

The invention is a TUNNETT (tunnelling transit time) diode capable of use in millimeter and sub-millimeter wave applications. The injection region is thin, less than 50 nm, and of substantially uniform doping of high concentration. A metallic cathode grown on the injection region forms a Schottky barrier and a contact to the diode. The drift region is less than 1 micrometer in thickness and of the same semiconductivity type as the injector but of substantially reduced doping concentration. The collector region is of the same semiconductivity type as the drift region but of substantially higher doping concentration.

The TUNNETT of this invention was grown with a GaAs collector, doped n-type to $3\times10^{18}$ cm$^{-3}$. On this was grown by epitaxy a 500 nm drift region of GaAs, doped n-type to $3\times10^{16}$ cm$^{-3}$. Then a Ge injection region 30 nm was grown on the drift region by vacuum epitaxy. The n-type doping was maintained by controlling the deposition temperature between 350° and 425° C. A TiW cathode was deposited on the injection region and an Au-Ge-Ni anode was deposited on the collector region.

DETAILED DESCRIPTION OF THE PREFERRED EMBODIMENTS

Figure 1:
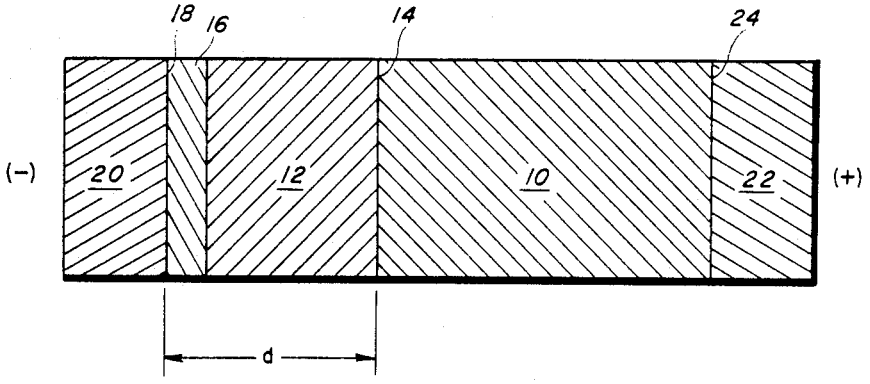
FIG. 1 is a pictorial representation of a TUNNETT according to this invention.

Referring now to the drawings, wherein like reference numerals designate identical or corresponding parts throughout the several views, and more particularly to FIG. 1 thereof, there is shown a TUNNETT diode made in accordance with the teachings of this invention. A relatively thick collector region 10 of a given semiconductivity type, for example n-type, is made with a relatively high doping concentration such as $3\times10^{18}$ cm$^{-3}$. On this collector region 10 is grown a drift region 12 of the same semiconductivity type, n-type, but at a considerably reduced doping concentration such as $3\times10^{16}$cm $^{-3}$. The doping in the drift region 12 must be less than one-tenth that of the collector region 10. In order to facilitate epitaxial growth of the drift region 12 and to insure a good drift-collector interface 14, the drift region 12 may be of the same material as the collector 10 but of different doping concentration. The use of GaAs for both collector 10 and drift region 12 has provided TUNNETTs with superior characteristics. The injector region 16 is grown on top of the drift region 12. Because the carriers tunnel through the potential barrier created in the injector region 16, it is important that this region be between 10 and 50 nm thick and of a fairly uniform doping concentration of the same semiconductivity type as the drift region 12, n-type in this example. The doping concentration should be at least ten times that of the drift region 12. The thickness requirement insures that tunneling dominates conduction across the barrier. The requirements on doping concentration insure that the barrier is simple and confined to the injector region 16. It has been found that a good injector region 16 can be grown by depositing Ge by vacuum epitaxy onto the GaAs drift region 12. This technique is carried out in an ultra-high vacuum (UHV) chamber pumped to $10^{-10}$ torr. A tantalum tube oven in the UHV chamber is loaded with Ge and then heated to 700° to 800° C. The semiconductor chip comprising the collector 10 and drift region 12 is heated to between 350°–425° C. and then placed into the tantalum oven. The Ge is thereby deposited onto the drift region 12. The n-type concentration is caused by native defects and dislocations and can be controlled to near $10^{18}$cm$^{-3}$ by varying the temperature of the chip in the range of 350°–425° C. The dependence of carrier concentration upon deposition temperature is more fully described by Christou et al. in Electronic Letters, vol. 15, pages 324–325, 1979.

An alternate doping procedure is to grow the Ge at 425° C. and then electron-beam anneal at electron beam densities between 0.02 and 0.06 joules cm$^{-2}$.

The injector 16 can also be made of GaAlAs grown by molecular beam epitaxy with a high dopant concentration such as $1\times10^{18}$cm$^{-3}$. GaAlAs comprises a range of semiconducting alloys, preferably with atomic compositions, expressed as atomic percents, for Ga between 0.33 and 0.40, Al between 0.33 and 0.20, and As between 0.33 and 0.40. This method allows fabrication of injectors as thin as 10 nm.

The transit time of the TUNNETT is determined by the combined thickness d of the injector 16 and drift region 12. The relationship is given by $\tau=v_s/d$ where $v_s$ is the saturated carrier velocity, about $10^7$ cm/s for GaAs. Thus, if the injector 16 is 30 nm thick and the drift region 12 is 500 nm thick, the TUNNETT has a transit time of about 5 picoseconds and its frequency response should extend to 400 GHz.

A metallic anode 20 is deposited on the injector region 16 and forms a Schottky barrier on the semiconductor side of the interface 18 between the cathode 20 and injector region 16. Carriers tunnel through the Schottky barrier into the injector region 16. On the other side of the TUNNETT is placed a metallic anode 22 which forms an ohmic junction at the interface 24 with the collector region 10. Both cathode 20 and anode 22 are good conductors and thus can serve as interconnects to other devices. Alternatively because the collector region 10 is reasonably thick and of moderate conductiveity it can form short interconnects without the need of an anode 22. The two ends have been labelled cathode 20 and anode 22 in conformance with the polarity convention noted in FIG. 1. The TUNNETT can also operate in reverse bias with the polarity reversed. Because the TUNNETT is a two-terminal electronic device it is referred to as a diode.

Figure 2:
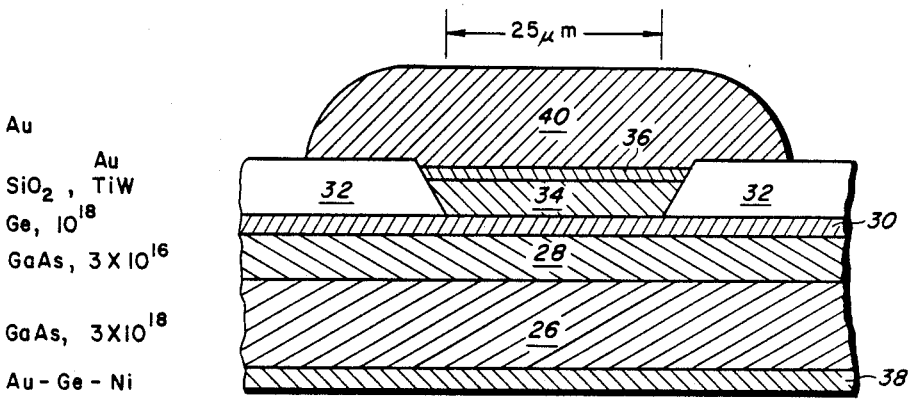
FIG. 2 is a cross section of a TUNNETT fabricated according to the method of this invention.

A TUNNETT according to the present invention has been fabricated and tested and is shown in FIG. 2. The structure of this device was accomplished by first polishing an n+ GaAs substrate previously doped to a concentration of $3\times10^{18}$ cm$^{-3}$. The substrate was polished to a thickness of 125 micrometers (5 mils) to produce a collector 26. Then a 500 nm thick drift region 28 of n-type GaAs was grown on top of the collector 26 by either molecular beam epitaxy or vapor phase epitaxy (molecular beam epitaxy was used in the example). The drift region 28 was grown with a silicon doping concentration of $3\times10^{16}$ cm.

The resultant structure was etched and then placed in a ultrahigh vacuum system where it was desorbed at 575° C. for 15 minutes. The temperatue of the collector-drift region structure was then reduced to the range of 350°–425° C. and a 30 nm thick injector 30 was grown by vacuum epitaxy. The injector 30 was made of germanium and its n-type concentration of $1\times10^{18}$ cm$^{-3}$ controlled by controlling the temperature in the above stated temperature range.

Then a 800 nm field insulator 32 of silicon dioxide was deposited on top of the injector 30. A 25 micrometer (1 mil) square window was opened in the silicon dioxide by standard lithographic techniques.

A cathode was formed in the window by first depositing 300 nm of TiW metallization 34 (88 wt % W and 12 wt % Ti) on the injector 30 and then depositing 300 nm of a gold metallization 36 on top of the TiW metallization 34. Excess metallization of the TiW and gold was removed by using a 32 micrometer (1½mil) mask centered on the window and etching the gold 36 and TiW 34.

An anode 38 was formed on the back of the collector 26 by depositing an Au-Ge-Ni metallization (80 wt % Au, 10 wt % Ge, and 10 wt % Ni) while the structure was held at 425° C. Finally a cathode contact 40 was formed over the gold metallization 36 and a small part of the surrounding field oxide 32 by plating gold to a thickness of about 1 micrometer. The gold-metallization can be extended to provide a contact for an interconnection metallization or to form a bonding pad for bonding wires.

Figure 3:
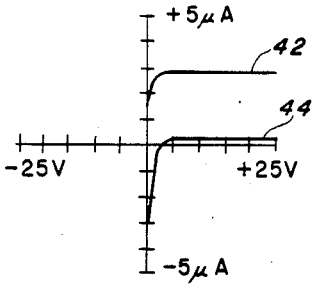
FIG. 3 is a graph of the forward DC current-voltage characteristics of the TUNNETT of FIG. 2. Voltage is plotted on the horizontal axis and current on the vertical axis.
Figure 4:
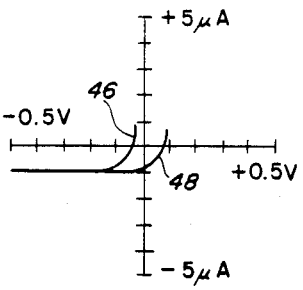
FIG. 4 is a graph of the reverse DC current-voltage characteristics of the same TUNNETT whose characteristics are given in FIG. 3. The voltage scale is magnified 50 times from that of FIG. 3.

A device fabricated according to the above procedure was tested. Its DC I-V (current voltage) characteristics are shown in FIGS. 3 and 4 which have differing voltage scales. The forward DC characteristics for the TUNNETT given by curve 42 were measured with the polarities applied as illustrated in FIG. 1, i.e. with a positive voltage on the Au-Ge-Ni anode 38 and a negative voltage on the gold cathode 40 as shown in FIG. 2. Also shown in FIG. 3 is a curve 44 for the I-V characteristics of a device built just like the TUNNETT but without the Ge injector 30. The reverse characteristics shown in FIG. 4 were measured with the opposite polarities of applied voltage. Curve 46 gives the reverse DC characteristics for the TUNNETT while curve 48 gives the corresponding characteristics for the device without the Ge injector.

What has been described is a TUNNETT and a method of making it in which a very thin injector region, uniformly doped at a high concentration, provides a hyperabrupt injection interface of less than 50 nm so that low drift times are obtained. Previously made TUNNETTs lacked a hyperabrupt injector interface because the vapor phase epitaxy used could not make thin and highly doped layers. The resultant high electric field in the thin injection region leads to lower oscillator power requirements and may allow the TUNNETT to be self-oscillating i.e. the TUNNETT would be self-biasing without the use of an additional RF oscillator. Furthermore, the high electric field and hyperabrupt injection interface will result in nearly all the current being tunneling current so that the injected current will be in phase with the RF voltage.

Using the described fabrication method will result in a sharp interface between the Ge injector and the GaAs drift region because of the utilization of the low temperature vacuum epitaxy process. Furthermore the Ti-W metallization forming the cathode provides better reliability and reduced susceptibility to burnout. Because the TUNNETT of the invention can be made with a larger area than previous TUNNETTs, operating power densities can be held low thus reducing temperature and prolonging device lifetimes.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A TUNNETT diode comprising:

a substrate of a semiconductor material;

a drift region less than 1 micrometer in thickness adjacent to said substrate comprising a semiconductor of the same type as and of dopant concentration at least ten times less than said substrate;

an epitaxial layered injection region of different semiconductor material compared to said drift region less than 50 nm in thickness adjacent to said drift region comprising a semiconductor of the same conductivity type as and of dopant concentration at least ten times greater than said drift region; and a metallic electrode adjacent to said injection region forming a Schottky barrier therewith.

2. A TUNNETT diode as recited in claim 1, wherein said substrate consists essentially of doped GaAs and said drift region consists essentially of GaAs with said relative dopant concentration and epitaxial to said substrate.

3. A TUNNETT diode as recited in claim 2, wherein said injection region consists essentially of Ge with said relative dopant concentration.

4. A TUNNETT diode as recited in claim 3, wherein said Ge injection region has substantially uniform doping.

5. A TUNNETT diode as recited in claim 2, wherein said injection region consists essentially of doped epitaxial GaAlAs.

6. A TUNNETT diode as recited in claim 4, wherein the electrode comprises a first layer adjacent to said injection region of TiW and a second layer of Au adjacent to said first layer.

7. A TUNNETT electronic device as recited in claim 5 further comprising an anode forming an ohmic contact region to the GaAs substrate, said anode consisting essentially of Au-Ge-Ni.

8. A TUNNETT diode comprising:

an anode of Au-Ge-Ni;

a collector of n-type GaAs doped to $3\times10^{18}$ $cm^{-3}$ of thickness of substantially 125 micrometer, adjacent to said anode;

a drift region of GaAs of 500 nm thickness epitaxial to said collector and with a Si doping of $3\times10^{16}$ $cm^{-3}$;

an injector of Ge of 30 nm thickness epitaxial to said drift region and with an n-type dopant concentration of $1\times10^{18}$ $cm^{-3}$;

a field insulator of $SiO_2$ adjacent to said injector of thickness of substantially 800 nm with a 25 micrometer window therethrough;

a first cathode layer of TiW(88 wt % W and 12 wt % Ti) of 300 nm thickness adjacent to said injector and within said window;

a second cathode layer of Au of 300 nm thickness adjacent to said first cathode layer and within said window;

a cathode contact of Au adjacent to said second cathode layer and partially within said window.

* * * * *